US012328842B2

(12) United States Patent
Wang et al.

(10) Patent No.: US 12,328,842 B2
(45) Date of Patent: Jun. 10, 2025

(54) IMMERSED LIQUID COOLING APPARATUS AND LIQUID COOLING SYSTEM

(71) Applicant: Beijing Bytedance Network Technology Co., Ltd., Beijing (CN)

(72) Inventors: Jian Wang, Beijing (CN); Bin Lin, Beijing (CN); Zhichao Lv, Beijing (CN); Shifeng Wang, Beijing (CN); Yulong Wang, Beijing (CN); Ruidong Wang, Beijing (CN)

(73) Assignee: Beijing Bytedance Network Technology Co., Ltd., Beijing (CN)

( * ) Notice: Subject to any disclaimer, the term of this patent is extended or adjusted under 35 U.S.C. 154(b) by 0 days.

(21) Appl. No.: 18/750,358

(22) Filed: Jun. 21, 2024

(65) Prior Publication Data

US 2024/0349446 A1    Oct. 17, 2024

Related U.S. Application Data

(63) Continuation of application No. PCT/CN2022/138119, filed on Dec. 9, 2022.

(30) Foreign Application Priority Data

Dec. 22, 2021  (CN) .......................... 202111582976.0

(51) Int. Cl.
  *H05K 7/20*  (2006.01)
(52) U.S. Cl.
  CPC ..... *H05K 7/20236* (2013.01); *H05K 7/20272* (2013.01); *H05K 7/20781* (2013.01)
(58) Field of Classification Search
  None
  See application file for complete search history.

(56) References Cited

U.S. PATENT DOCUMENTS

| 10,405,457 B2 | 9/2019 | Boyd et al. |
| 10,966,349 B1 * | 3/2021 | Lau .............. H05K 7/20236 |

(Continued)

FOREIGN PATENT DOCUMENTS

| CN | 107979955 A | 5/2018 |
| CN | 207820429 U | 9/2018 |

(Continued)

OTHER PUBLICATIONS

International Search Report and Written Opinion received for PCT Patent Application No. PCT/CN2022/138119, mailed on Feb. 20, 2023, 3 pages.

(Continued)

*Primary Examiner* — Courtney L Smith

(57) ABSTRACT

Examples of the disclosure relate to an immersed liquid cooling apparatus and a liquid cooling system. The immersed liquid cooling apparatus includes a cabinet, wherein the cabinet includes a cooling groove and a mounting groove integrated on an outer wall of the cooling groove, the cooling groove is used for accommodating an electronic device to be cooled and a first cooling liquid, the mounting groove is used for accommodating the first cooling liquid, and the cooling groove is in fluid communication with the mounting groove by means of a through hole; and a heat exchange module suitable for being inserted into the mounting groove, wherein the heat exchange module includes a cooling liquid circulation pipeline, a heat exchanger and a cooling liquid driving apparatus, the cooling liquid circulation pipeline is in fluid communication with the heat exchanger for providing a second cooling liquid for the heat exchanger, the heat exchanger is used for using the second cooling liquid inside the heat exchanger to cool the first cooling liquid outside the heat exchanger, and the cooling liquid driving apparatus is configured to circulate the first (Continued)

cooling liquid between the mounting groove and the cooling groove.

20 Claims, 12 Drawing Sheets

(56) References Cited

U.S. PATENT DOCUMENTS

| | | | | |
|---|---|---|---|---|
| 11,169,582 B2* | 11/2021 | Mao | ................ | H01M 10/6568 |
| 11,178,790 B2* | 11/2021 | Aoki | ................ | H05K 7/20772 |
| 11,470,742 B2* | 10/2022 | Xue | ................ | H05K 7/20872 |
| 11,516,943 B2* | 11/2022 | Bilan | ................ | F28F 27/00 |
| 11,856,727 B2* | 12/2023 | Montes Monteserin | ................ | H05K 7/20263 |
| 11,937,407 B2* | 3/2024 | Franz | ................ | H05K 7/20781 |
| 2016/0234970 A1* | 8/2016 | Shelnutt | ................ | H05K 7/20818 |
| 2018/0279507 A1* | 9/2018 | Midgley | ................ | H05K 7/20236 |
| 2019/0014685 A1* | 1/2019 | So | ................ | H05K 7/20236 |
| 2020/0015383 A1 | 1/2020 | Gao | | |
| 2020/0253086 A1* | 8/2020 | Ohga | ................ | H05K 7/20272 |
| 2020/0288601 A1 | 9/2020 | Gao | | |
| 2020/0323100 A1 | 10/2020 | Chiu et al. | | |
| 2020/0323108 A1 | 10/2020 | Bilan et al. | | |
| 2021/0307210 A1* | 9/2021 | Wong | ................ | H05K 7/20327 |
| 2022/0240422 A1* | 7/2022 | Heydari | ................ | H05K 7/20772 |

FOREIGN PATENT DOCUMENTS

| | | |
|---|---|---|
| CN | 109757062 A | 5/2019 |
| CN | 109952003 A | 6/2019 |
| CN | 212482191 U | 2/2021 |
| CN | 214257034 U | 9/2021 |
| CN | 114096133 A | 2/2022 |
| CN | 216532420 U | 5/2022 |
| CN | 114096133 B | 10/2024 |
| JP | 2019012470 A | 1/2019 |
| JP | 7601318 B2 | 12/2024 |
| WO | 2017037860 A1 | 3/2017 |
| WO | 2019060576 A2 | 3/2019 |
| WO | 2020183038 A1 | 9/2020 |
| WO | 2020/254917 A1 | 12/2020 |

OTHER PUBLICATIONS

Office Action received for Chinese Patent Application No. 202111582976.0, mailed on Mar. 7, 2024, 8 pages.
International Preliminary Report on Patentability for International Application No. PCT/CN2022/138119, mailed Jul. 4, 2024, 13 pages.
Notice of Allowance for Japanese Application No. 2024-538240, mailed Nov. 5, 2024, 6 pages.
Partial Supplementary European Search Report for European Application No. 22909790.2, mailed Feb. 21, 2025, 15 pages.

* cited by examiner

IMMERSED LIQUID COOLING APPARATUS AND LIQUID COOLING SYSTEM

CROSS-REFERENCE TO RELATED APPLICATION(S)

This application is a U.S. National Stage Application of PCT Application Serial No. PCT/CN2022/138119, filed Dec. 9, 2022, which claims priority to Chinese patent application No. 202111582976.0 filed Dec. 22, 2021 and entitled "Immersed liquid cooling apparatus and liquid cooling system", the disclosures of which are incorporated herein by reference in-their entireties herein by reference.

FIELD

Examples of the disclosure generally relate to the technical field of cooling of electronic devices, and particularly relate to an immersed liquid cooling apparatus and a liquid cooling system including the immersed liquid cooling apparatus.

BACKGROUND

As a new generation of information communication technologies such as 5G, cloud computation, big data and artificial intelligence and the real economy have been integrated and developed, data centers have been oriented towards the whole society from some companies, and become a novel type of infrastructures.

The novel infrastructures put forward higher requirements on cooling solutions and overall energy efficiency of a cooling center. Data is growing faster than imagined with the advent of the period of big data. In order to process, store and transmit massive data, power consumption of an information technology (IT) device is increased exponentially, which presents a huge challenge of cooling chips. Traditional cooling solutions cannot satisfy requirements of efficient cooling of an electronic information device any more. Moreover, national, local and industrial energy policies have been successively issued, which put forward higher requirements for energy-saving indexes of the data centers.

Room-level air conditioners and underfloor air supply cooling methods are generally adopted in traditional computer rooms of the data centers. The method, low in construction cost and high in utilization rate of computer rooms, is used for cooling 3 kW-5 KW single cabinets. However, since a large number of rack and blade servers have been used in the computer rooms, the number of devices in the single cabinets, power density and heating density have been significantly increased. Traditional computer-room-level air conditioners are unable to solve the cooling problem of the IT devices. Accordingly, in-row air conditioners and backplane air conditioners emerged. Terminals of such novel air conditioners are closer to heat sources, so the problems of local hot spots and high heating density can be solved. Power consumption of draught fans is reduced through short-distance cold transmission, thereby saving energy. All of the room-level air conditioners, the in-row air conditioners and the backplane air conditioners perform cooling through heat exchange between cold air and central processing units (CPUs) of servers after cooling the air. Due to low heat exchange efficiency and heat flux density of air, air-cooled servers have problems of high cooling energy consumption, loud noise, low device density, etc.

In order to solve the cooling problem of an IT device having ultra-high power density, the data centers began to adopt a liquid cooling technology. A working fluid is used as an intermediate heat transfer medium to transfer heat from a heating area to a distant place for cooling. Cooling efficiency of the liquid cooling technology is significantly greater than that of air cooling. Therefore, the cooling problem of a high-density server can be effectively solved, energy consumption of cooling systems can be reduced, and noise can be lowered.

In existing data centers adopting liquid cooling solutions, a conventional immersed liquid cooling system is generally a large-sized cabinet (generally having a length about 3 m) equipped with one or more cooling liquid distribution units (CDUs). The cooling liquid distribution units are provided on left and right sides of the cabinet. The inventor of the disclosure discovers that such a conventional immersed liquid cooling system has plenty of problems.

Firstly, the cabinet of the conventional immersed liquid cooling system is difficult to operate and maintain due to the large size. Since an operator can only stand in front of the cabinet instead of standing on the left or right side of the cabinet for maintenance, operation is difficult. For instance, in the current immersed liquid cooling industry, systems applied to immersion cooling of servers basically utilize horizontal cabinets having a length about 2 m-3 m, leading to difficulties in implementation, operation and maintenance.

Secondly, since the conventional immersed liquid cooling system is equipped with one or more sets of cooling liquid distribution units, the system becomes complex in overall structure.

Thirdly, the conventional immersed liquid cooling system is poorly adapted to the IT device. In the conventional immersed liquid cooling system, it is required to use cabinets having the same height to assemble IT devices having different heights. If the height of the IT device to be assembled is less than the height of the cabinet, the server is required to share more cooling liquids, which results in higher cost.

Fourthly, the IT device on which the conventional immersed liquid cooling system is carried is required to have a large capacity. Therefore, device and liquid waste will be caused for some small-scale IT systems.

Therefore, there is a need of improved liquid cooling solutions to data centers.

SUMMARY

An objective of the disclosure is to provide an immersed liquid cooling apparatus and a liquid cooling system including the immersed liquid cooling apparatus, so as to at least partially solve the above problems in the prior art.

According to a first aspect of the disclosure, an immersed liquid cooling apparatus is provided. The immersed liquid cooling apparatus includes a cabinet, where the cabinet includes a cooling groove and a mounting groove integrated on an outer wall of the cooling groove, the cooling groove is used for accommodating an electronic device to be cooled and a first cooling liquid, the mounting groove is used for accommodating the first cooling liquid, and the cooling groove is in fluid communication with the mounting groove by means of a through hole; and a heat exchange module suitable for being inserted into the mounting groove, where the heat exchange module includes a cooling liquid circulation pipeline, a heat exchanger and a cooling liquid driving apparatus, the cooling liquid circulation pipeline is in fluid communication with the heat exchanger to be used for providing a second cooling liquid for the heat exchanger, the heat exchanger is used for using the second cooling liquid inside the heat exchanger to cool the first cooling liquid outside the heat exchanger, and the cooling liquid driving apparatus is used for enabling the first cooling liquid to be circulated between the mounting groove and the cooling groove.

The cabinet in the immersed liquid cooling apparatus according to an example of the disclosure is small in size and light in overall weight, such that the problem of difficult deployment is solved. An operator can perform maintenance on all sides of the liquid cooling apparatus such that components of an internal electronic device can be extremely easily maintained. In addition, since the cabinet and the heat exchange module are integrated together, the entire system is not required to be equipped with an additional cooling liquid distribution unit for usage and therefore is extremely flexible and convenient.

In some examples, the through hole includes a first set of through holes and a second set of through holes. In a case that the heat exchange module is inserted into the mounting groove, the cooling liquid driving apparatus is provided to be close to the first set of through holes to be used for driving the first cooling liquid in the mounting groove into the cooling groove and enabling the first cooling liquid in the cooling groove to flow into the mounting groove by means of the second set of through holes. In such examples, the first cooling liquid can rapidly circulate between the mounting groove and the cooling groove by arranging the cooling liquid driving apparatus adjacent to the first set of through holes.

In some examples, the first set of through holes are provided to be close to a bottom side of the mounting groove, and the second set of through holes are provided to be close to a top side of the mounting groove. In such examples, most of the first cooling liquid in the mounting groove can circularly flow into the cooling groove, such that cooling performance of the liquid cooling apparatus is improved.

In some examples, in the case that the heat exchange module is inserted into the mounting groove, the cooling liquid driving apparatus is provided to be close to the bottom side of the mounting groove, and the heat exchanger is located above the cooling liquid driving apparatus and adjacent to the cooling liquid driving apparatus. In such examples, the first cooling liquid cooled by the heat exchanger can be timely transported to the cooling groove by arranging the cooling liquid driving apparatus adjacent to the heat exchanger, such that the cooling performance of the liquid cooling apparatus is further improved.

In some examples, the cooling liquid driving apparatus includes a plurality of circulation pumps. In the case that the heat exchange module is inserted into the mounting groove, each of the plurality of circulation pumps is provided to be close to a corresponding through hole of the first set of through holes. In such examples, the plurality of circulation pumps drive the first cooling liquid into the corresponding through holes such that a speed of the first cooling liquid circulating between the mounting groove and the cooling groove can be further increased.

In some examples, the cabinet further includes an outer frame and a top cover. The outer frame surrounds the cooling groove and the mounting groove. The top cover is rotatably connected to the outer frame and is switchable between a closed state in which the cooling groove is closed and an opened state in which the cooling groove is opened. In such examples, by closing the first cooling groove with the top cover, leakage of the first cooling liquid in the cooling groove can be reduced and external contaminants can be prevented from entering the cooling groove.

In some examples, the top cover includes a frame and a transparent portion surrounded by the frame. In such examples, the electronic device in the cooling groove can be observed through the transparent portion such that operating states of the components of the electronic device can be timely known.

In some examples, a first seal ring is provided on a side of the top cover facing the cooling groove. In a case that the top cover is in the closed state, the top cover is sealed off from the cooling groove by the first seal ring. In such examples, performance of seal between the top cover and the cooling groove can be improved by using the first seal ring such that leakage of the first cooling liquid in the cooling groove can be further reduced.

In some examples, the cabinet further includes a hydraulic driving apparatus. The hydraulic driving apparatus is connected between the outer frame and the top cover for driving the top cover to be switched between the closed state and the opened state. In such examples, the top cover can be conveniently opened or closed by using the hydraulic driving apparatus.

In some examples, the hydraulic driving apparatus includes a pair of hydraulic rods. One of the pair of hydraulic rods is connected between a first side of the top cover and the outer frame. The other one of the pair of hydraulic rods is connected between a second side of the top cover and the outer frame. The first side and the second side of the top cover are opposite sides. In such examples, the states of the top cover can be rapidly and reliably switched by means of the pair of hydraulic rods oppositely provided.

In some examples, the immersed liquid cooling apparatus further includes a height-adaptive support. The height-adaptive support is provided under the cooling groove to support the cooling groove. In such examples, a user can match, according to actual depth requirements of the electronic device, liquid cooling devices having different height-adaptive supports such that a usage amount of the first cooling liquid can be greatly reduced, and carbon neutralization can be boosted.

In some examples, the heat exchange module further includes a plurality of cooling liquid replacement blocks. In the case that the heat exchange module is inserted into the mounting groove, the plurality of cooling liquid replacement blocks may be at least partially immersed into the first cooling liquid in the mounting groove. In such examples, when the heat exchange module is inserted into the mounting groove, the cooling liquid replacement blocks can reduce a volume of the first cooling liquid such that a usage amount of the first cooling liquid required in the cabinet and overall cost can be reduced.

In some examples, in the case that the heat exchange module is inserted into the mounting groove, the plurality of cooling liquid replacement blocks are close to a top side of the mounting groove.

In some examples, channels for the first cooling liquid to flow through are provided between adjacent cooling liquid replacement blocks of the plurality of cooling liquid replacement blocks. In such examples, the first cooling liquid can flow through the channels between the cooling liquid replacement blocks, such that a stable fluid path is formed.

In some examples, the heat exchange module further includes a support portion. When the heat exchange module is inserted into the mounting groove, the support portion is located outside the mounting groove. In such examples, the cabinet can reliably support the heat exchange module by means of the support portion. The support portion can prevent leakage of the first cooling liquid in the mounting groove.

In some examples, a second seal ring is provided on a side of the support portion facing the mounting groove. When the heat exchange module is inserted into the mounting groove, the support portion is sealed off from the mounting groove by the second seal ring. In such examples, performance of seal between the support portion and the mounting groove can be improved by using the second seal ring, such that leakage of the first cooling liquid in the mounting groove is further reduced.

In some examples, the cabinet has a height ranging from 1000 mm to 1100 mm, a width ranging from 750 mm to 850 mm and a length ranging from 500 mm to 800 mm. In such examples, if a cabinet having the substantially same height and width as a conventional cabinet, a length of the cabinet is significantly reduced compared with a length of the conventional cabinet, and therefore a volume of the cabinet is also significantly reduced.

In some examples, the first cooling liquid includes a fluorinated liquid or mineral oil, and/or the second cooling liquid includes deionized water.

In some examples, the electronic device includes a server or a switch.

According to a second aspect of the disclosure, a liquid cooling system is provided. The liquid cooling system includes a plurality of immersed liquid cooling apparatuses provided side by side. Each immersed liquid cooling apparatus of the plurality of immersed liquid cooling apparatuses is the immersed liquid cooling apparatus according to the first aspect of the disclosure.

These contents are provided to introduce selection of concepts in a simplified manner, and will be further described below in the detailed description of embodiments. These contents are neither intended to identify key features or essential features of contents of the disclosure, nor intended to limit the scope of the contents of the disclosure.

BRIEF DESCRIPTION OF THE DRAWINGS

The above and other objectives, features and advantages of examples of the disclosure will be easy to understand by reading the following detailed descriptions with reference to accompanying drawings. In the accompanying drawings, several examples of the disclosure are shown by way of instances in a non-limitative way.

DETAILED DESCRIPTION OF EMBODIMENTS

Preferred examples of the disclosure will be described in more detail below with reference to accompanying drawings. Although the preferred examples of the disclosure are shown in the accompanying drawings, it should be understood that the disclosure can be implemented in various forms and should not be limited by the examples set forth herein. On the contrary, these examples are provided to make the disclosure more thorough and complete, and to fully convey the scope of the disclosure to those skilled in the art.

The terms "comprise", "include" and their variations used herein represent open inclusion, that is, "comprise but not limited to" and "include but not limited to". The term "or" represents "and/or" unless specifically stated. The term "on the basis of" represents "at least partially on the basis of". The terms "an exemplary example" and "an example" represent "at least one exemplary example". The term "another example" represents "at least one another example". The terms "first", "second" etc. can refer to different objects or the same object.

As described above, the conventional immersed liquid cooling system has various problems, such as difficult operation and maintenance, complex overall architecture, poor adaptability, and waste of cooling liquids. Examples of the disclosure provide an immersed liquid cooling apparatus with a heat exchanger integrated therein and a liquid cooling system including the immersed liquid cooling apparatus, so as to reduce operation and maintenance difficulty levels, reduce architecture complexity, enhance adaptability and conserve cooling liquids. Principles of the disclosure will be described hereinafter in combination with FIGS. 1-13.

Figure 1:
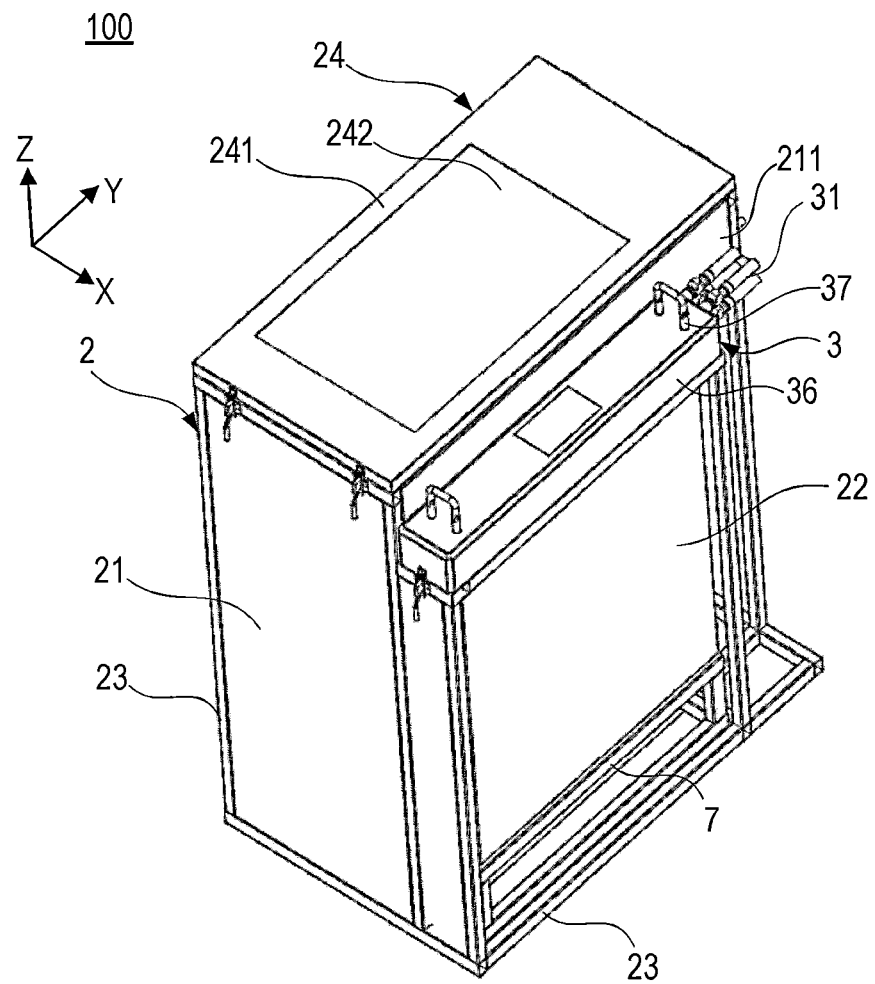
FIGS. 1 and 2 show schematic structural diagrams of an immersed liquid cooling apparatus according to an example of the disclosure, where a top cover is in a closed state in FIG. 1 and a top cover is in an opened state in FIG. 2.
Figure 2:
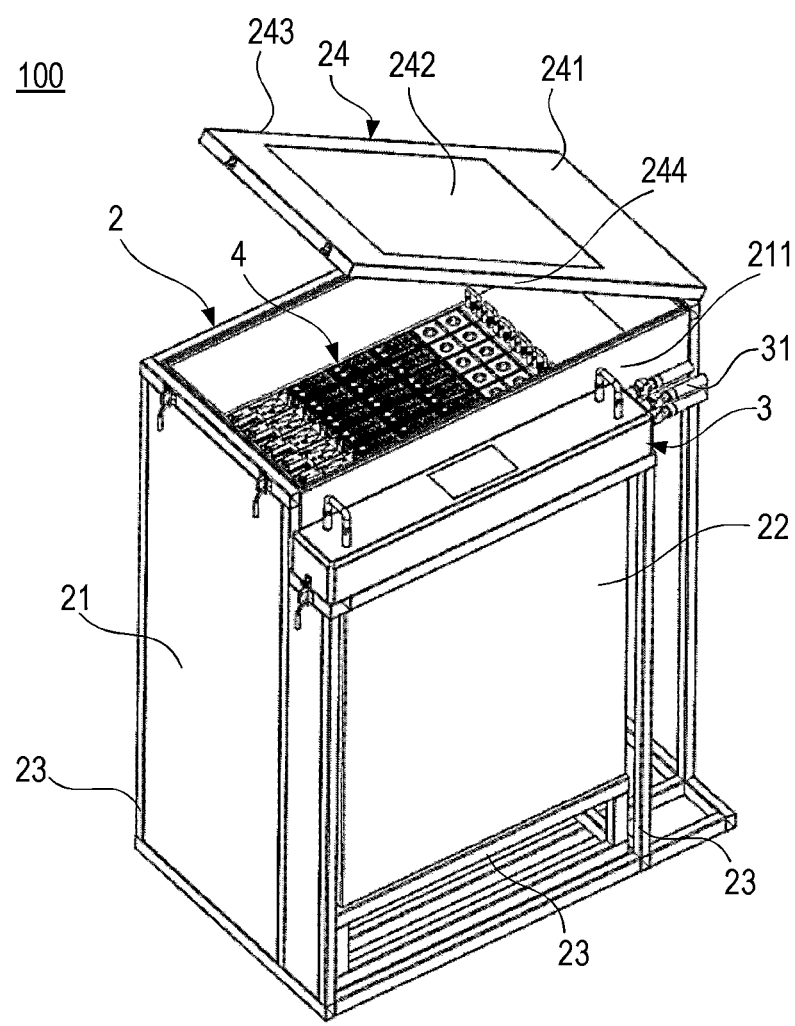
Figure 3:
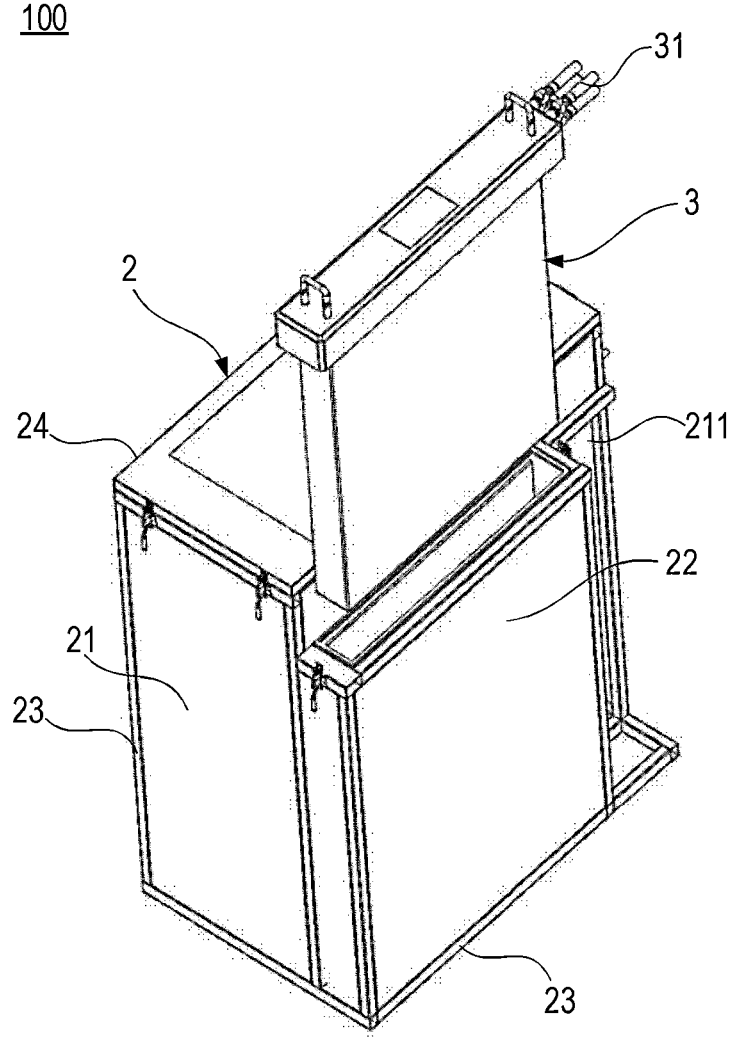
FIG. 3 shows a schematic structural diagram of the immersed liquid cooling apparatus shown in FIG. 1, where a heat exchange module is in a pulled-out state.
Figure 4:
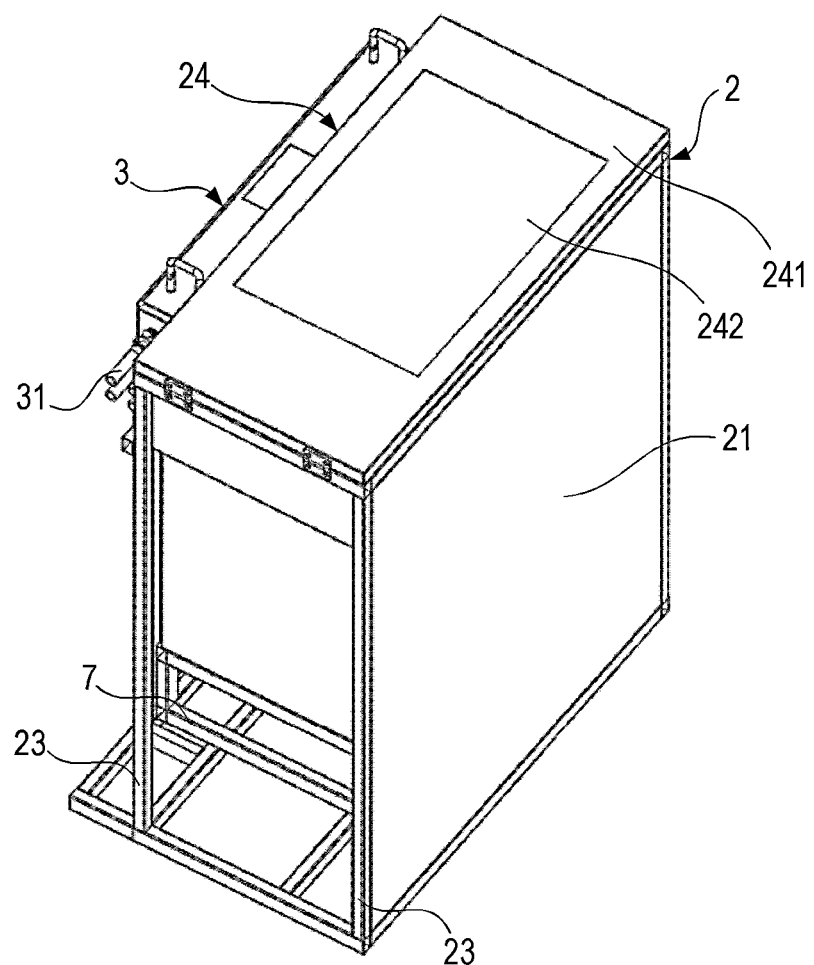
FIG. 4 shows a schematic structural diagram of the immersed liquid cooling apparatus shown in FIG. 1 viewed from another angle of view.
Figure 5:
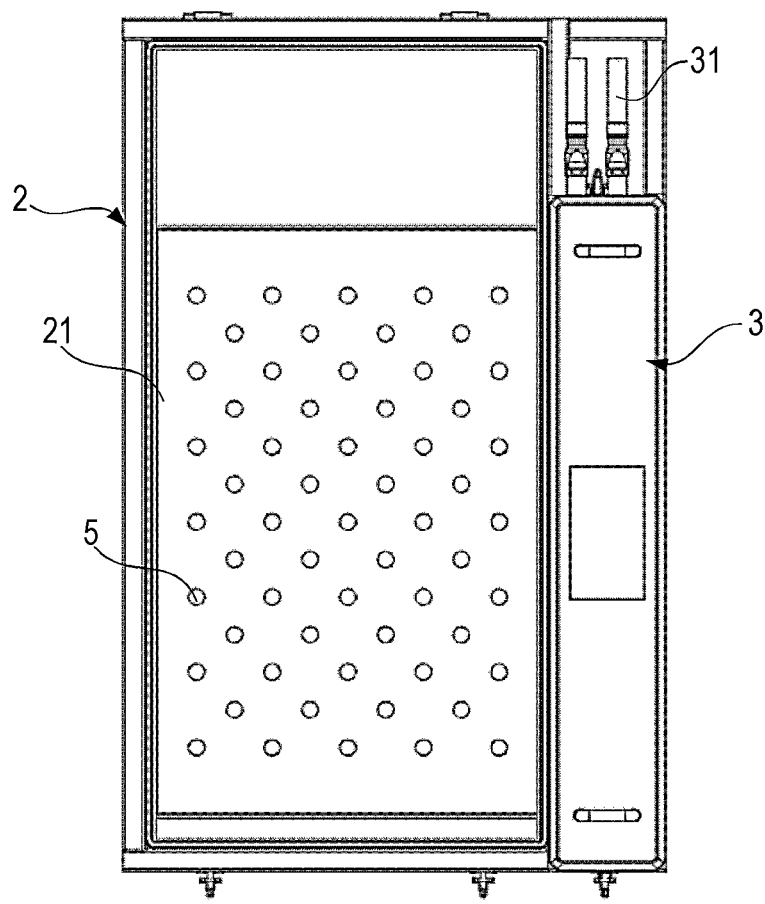
FIG. 5 shows a top view of the immersed liquid cooling apparatus shown in FIG. 2, where the top cover is not shown, such that a first cooling liquid in a cooling groove is shown.
Figure 6:
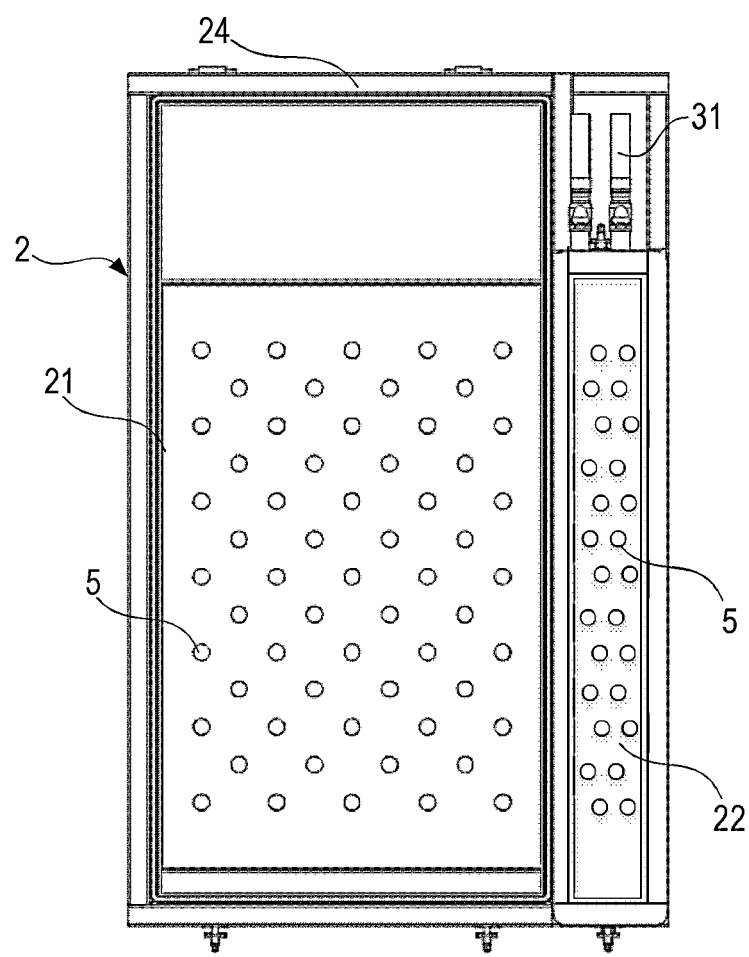
FIG. 6 shows a top view of the immersed liquid cooling apparatus shown in FIG. 2, where the top cover and a heat exchange module are not shown, such that a first cooling liquid in a cooling groove and a mounting groove is shown.

FIGS. 1 and 2 show schematic structural diagrams of an immersed liquid cooling apparatus 100 according to an example of the disclosure, where a top cover 24 is in a closed state in FIG. 1 and a top cover 24 is in an opened state in FIG. 2. FIG. 3 shows a schematic structural diagram of the immersed liquid cooling apparatus 100 shown in FIG. 1, where a heat exchange module 3 is in a pulled-out state. FIG. 4 shows a schematic structural diagram of the immersed liquid cooling apparatus 100 shown in FIG. 1 viewed from another angle of view. Reference numeral X in FIG. 1 indicates a length direction of the immersed liquid cooling apparatus 100. Reference numeral Y indicates a width direction of the immersed liquid cooling apparatus 100. Reference numeral Z indicates a height direction of the immersed liquid cooling apparatus 100.

As shown in FIGS. 1-4, the immersed liquid cooling apparatus 100 described herein includes a cabinet 2 and a heat exchange module 3 in general. The cabinet 2 includes an outer frame 23, a cooling groove 21, a mounting groove 22 integrated on an outer wall 211 of the cooling groove 21, and a top cover 24. The cooling groove 21 is configured to accommodate an electronic device 4 to be cooled and a first cooling liquid 5 (see FIGS. 5 and 6). The mounting groove 22 is configured to accommodate the heat exchange module 3 and the first cooling liquid 5 (see FIG. 6). The cooling groove 21 is in fluid communication with the mounting groove 22 through a through hole 6 (see FIG. 7). The heat exchange module 3 is suitable for being inserted into the mounting groove 22.

As shown in FIGS. 1-4, the outer frame 23 surrounds the cooling groove 21 and the mounting groove 22 in general so as to provide mechanical support for the cooling groove 21 and the mounting groove 22 to some extent. The cooling groove 21 and the mounting groove 22 may be mounted on the outer frame 23 through welding or other methods. In some examples, the outer frame 23 may be formed by welding profile square bars. In other examples, the outer frame 23 may also be formed through other processes or by using other materials, which is not strictly limited in an example of the disclosure.

In some examples, the cooling groove 21 and the mounting groove 22 may be formed by welding stainless steel plates. In other examples, the cooling groove 21 and the mounting groove 22 may be formed through other processes or by using other materials, which is not strictly limited in an example of the disclosure.

As shown in FIGS. 1 and 2, the top cover 24 is rotatably connected to the outer frame 23 and is switchable between a closed state in which the cooling groove 21 is closed and an opened state in which the cooling groove 21 is opened. FIG. 1 shows that the top cover 24 is in the closed state, while FIG. 2 shows that the top cover 24 is in the opened state. The top cover 24 in the closed state can reduce leakage of the first cooling liquid 5 in the cooling groove 21 and prevent external contaminants from entering the cooling groove 21. When the top cover 24 in the opened state, an operator can mount or maintain the electronic device 4 in the cooling groove 21 and inject the first cooling liquid 5 into the cooling groove 21.

In some examples, the first cooling liquid 5 includes a fluorinated liquid or mineral oil. In other examples, the first cooling liquid 5 may also be in other types, which is not strictly limited in an example of the disclosure.

In some examples, the top cover 24 may be opened relative to the outer frame 23 by 90 degrees or above. At a maximum opening angle, a stopping member (not shown) may be provided to limit a position of the top cover 24.

In some examples, the top cover 24 may be connected to a side of the outer frame 23 by means of a hinge. In other examples, the top cover 24 may be connected to the outer frame 23 through other methods, such as through matching of a shaft hole, which is not strictly limited in an example of the disclosure.

In some examples, as shown in FIGS. 1 and 2, the top cover 24 includes a frame 241 and a transparent portion 242 surrounded by the frame 241. The frame 241 is connected to the outer frame 23 and may rotate relative to the outer frame 23. The frame 241 may be made of aluminum alloy or other types of metallic or non-metallic materials. The transparent portion 242 may be made of a transparent polycarbonate (PC) material or other types of transparent materials. By arranging the transparent portion 242, even when the top cover 24 is in the closed state, the operator can observe the electronic device 4 in the cooling groove 21 through the transparent portion 242, so as to timely know operating states of components of the electronic device 4.

In some examples, a first seal ring (not shown) is provided on a side of the top cover 24 facing the cooling groove 21. When the top cover 24 is in the closed state, the top cover 24 is sealed off from the cooling groove 21 by the first seal ring. The first seal ring may be made of ethylene propylene diene monomer (EPDM) rubber or other types of seal materials. Performance of seal between the top cover 24 and the cooling groove 21 can be improved by using the first seal ring such that leakage of the first cooling liquid 5 in the cooling groove 24 can be further reduced.

In some examples, in order to open or close the top cover 24, the cabinet 2 further includes a hydraulic driving apparatus (not shown). The hydraulic driving apparatus is connected between the outer frame 23 and the top cover 24 to be used for driving the top cover 24 to be switched between the closed state and the opened state. The top cover 24 can be conveniently opened or closed by means of the hydraulic driving apparatus.

In some examples, the hydraulic driving apparatus includes a pair of hydraulic rods (not shown). One of the pair of hydraulic rods is connected between a first side 243 of the top cover 24 and a corresponding side of the outer frame 23. The other one of the pair of hydraulic rods is connected between a second side 244 of the top cover 24 and a corresponding side of the outer frame 23. The first side 243 and the second side 244 of the top cover 24 are opposite sides. The states of the top cover 24 can be rapidly and reliably switched by means of the pair of hydraulic rods oppositely provided.

It should be understood that in other examples, the top cover 24 may be switched between the closed state and the opened state through other methods, which is not strictly limited in an example of the disclosure.

In some examples, a handle (not shown) may also be provided on a side of the top cover 24 facing away from the cooling groove 21. By means of such an arrangement, the operator can open and close the top cover 24 by gripping the handle.

Further, in an example according to the disclosure, since the heat exchange module 3 is suitable for being inserted into the mounting groove 22 or pulled out from the mounting groove 22, the operator can conveniently use different heat exchange modules 3 according to different cooling requirements of the electronic device 4.

As mentioned above, both the cooling groove 21 and the mounting groove 22 are used to accommodating the first cooling liquid 5. In the cooling groove 21, the first cooling liquid 5 may be used to immerse the electronic device 4 for cooling the electronic device 4. In the mounting groove 22, the heat exchange module 3 may be at least partially immersed in the first cooling liquid 5. The heat exchange module 3 may be connected to an external cooling device (such as a cooling tower) so as to receive a second cooling liquid provided by the external cooling device. A temperature of the second cooling liquid in the heat exchange module 3 is less than a temperature of the first cooling liquid 5 in the mounting groove 22 such that the first cooling liquid 5 in the mounting groove 22 can be cooled.

In some examples, the second cooling liquid in the heat exchange module 3 may include deionized water. In other examples, the second cooling liquid may also be in other types, which is not strictly limited in an example of the disclosure.

Figure 8:
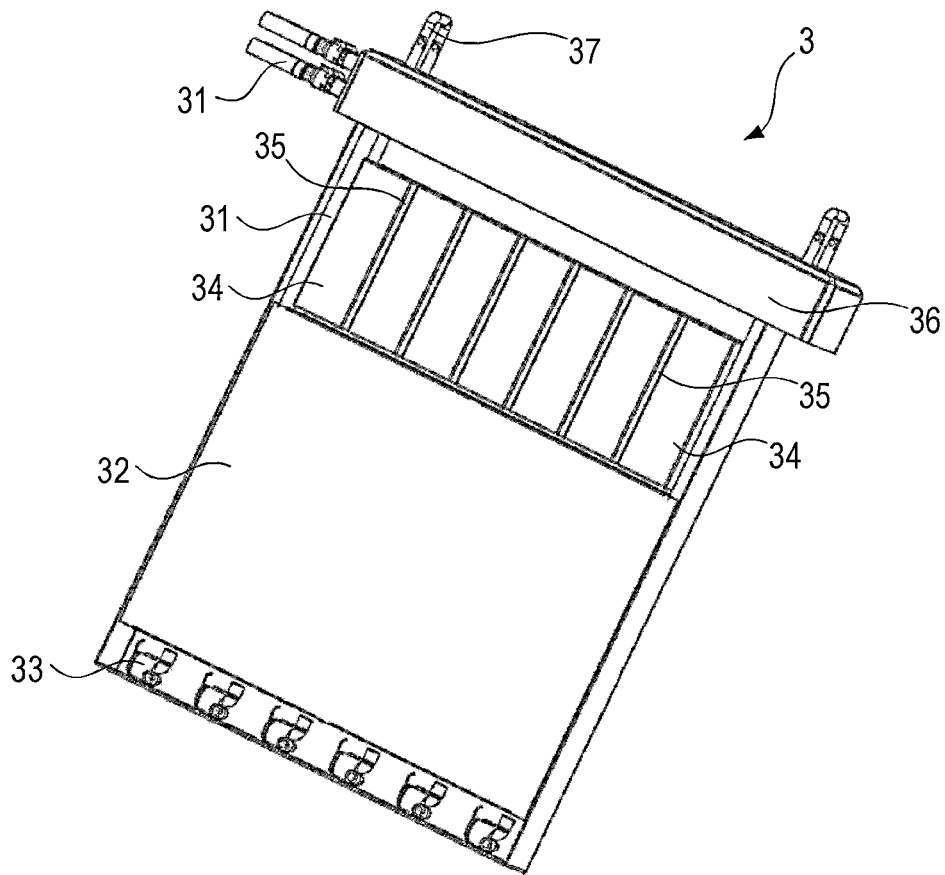
FIG. 8 shows a schematic structural diagram of a heat exchange module according to an example of the disclosure.

An exemplary structure of the heat exchange module 3 will be described below in combination with FIG. 8. As shown in FIG. 8, the heat exchange module 3 includes a cooling liquid circulation pipeline 31, a heat exchanger 32 and a cooling liquid driving apparatus 33. The cooling liquid circulation pipeline 31 is in fluid communication with the heat exchanger 32 for enabling the second cooling liquid to be circulated between the heat exchanger 32 and the external cooling device (such as a cooling tower). Through such an arrangement, a second cooling liquid having a low temperature can be provided for the heat exchanger 32. The heat exchanger 32 is configured to cool the first cooling liquid 5 outside the heat exchanger by means of the second cooling liquid inside the heat exchanger. The cooling liquid driving apparatus 33 is used for circulating the first cooling liquid 5 between the mounting groove 22 and the cooling groove 21. In this way, the first cooling liquid 5 having a low temperature entering the cooling groove 21 from the mounting groove 22 can absorb heat from the electronic device 4. The first cooling liquid 5 heated through heat absorption can enter the mounting groove 22 from the cooling groove 21 through the through hole 6 and be cooled again by the heat exchanger 32 in the mounting groove 22 to perform next circulation.

As shown in FIGS. 1-8, when the heat exchange module 3 is inserted into the mounting groove 22, the heat exchanger 32 and the cooling liquid driving apparatus 33 may be immersed in the first cooling liquid 5. Since the second cooling liquid received by means of the cooling liquid circulation pipeline 31 exits in the heat exchanger 32, a temperature of the first cooling liquid 5 in the mounting groove 22 can be reduced by the second cooling liquid.

In some examples, the cooling liquid circulation pipeline 31 may include two groups of liquid intake and return pipelines. Through such a redundant design, when one set of liquid intake and return pipelines do not operate, the other set of liquid intake and return pipelines can still normally operate, thereby improving reliability of the system.

In some examples, the heat exchanger 32 may include a plate heat exchanger. In other examples, the heat exchanger 32 may include other types of heat exchangers, which is not strictly limited in an example of the disclosure.

In some examples, dense micro-cavity structures may be provided in the heat exchanger 32, such that a contact area between the second cooling liquid and the heat exchanger 32 and heat exchange efficiency of the heat exchanger 32 are increased.

In some examples, the heat exchanger 32 may be made of a stainless steel material. In other examples, the heat exchanger 32 may be made of other types of materials having high thermal conductivity, which is not strictly limited in an example of the disclosure.

Figure 7:
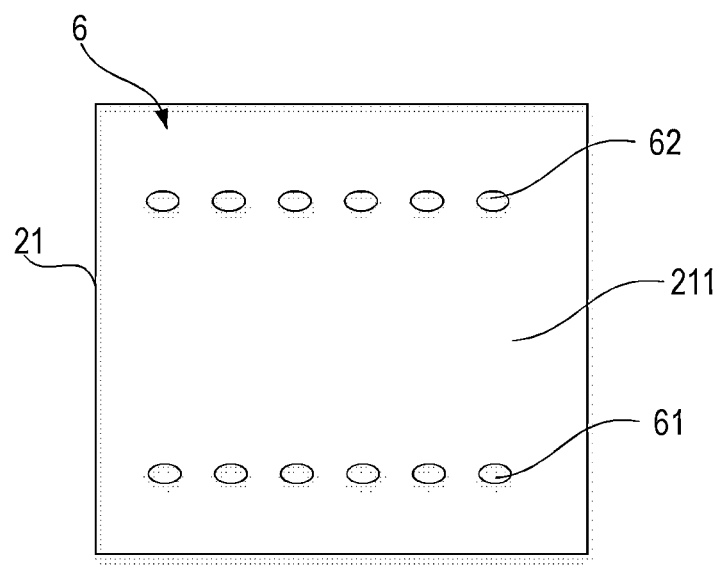
FIG. 7 shows a schematic structural diagram of an outer wall of a cooling groove on which a mounting groove is integrated according to an example of the disclosure.

FIG. 7 shows an exemplary arrangement of the through hole 6 on the outer wall 211 of the cooling groove 21. In some examples, as shown in FIG. 7, the through hole 6 include a first set of through holes 61 and a second set of through holes 62. As shown in FIGS. 1-4 and FIGS. 7 and 8, in the case that the heat exchange module 3 is inserted into the mounting groove 22, the cooling liquid driving apparatus 33 will be close to the first set of through holes 61 for driving the first cooling liquid 5 in the mounting groove 22 into the cooling groove 21 through the first set of through holes 61, and enabling the first cooling liquid 5 in the cooling groove 21 to flow into the mounting groove 22 by means of the second set of through holes 62.

In some examples, as shown in FIG. 7, each through hole of the first set of through holes 61 may be in an elliptical shape. It should be understood that in other examples, each through hole of the first set of through holes 61 may be in other shapes, such as a circular shape, a rectangular shape, a square shape and a strip shape, which is not strictly limited in an example of the disclosure.

Similarly, as shown in FIG. 7, each through hole of the second set of through holes 62 may be in an elliptical shape. In other examples, each through hole of the second set of through holes 62 may be in other shapes, such as a circular shape, a rectangular shape, a square shape and a strip shape, which is not strictly limited in an example of the disclosure.

In some examples, as shown in FIG. 7, the first set of through holes 61 are close to a bottom side of the mounting groove 22 and the second set of through holes 62 are close to a top side of the mounting groove 22. Through such an arrangement, most of the first cooling liquid 5 in the mounting groove 22 can participate in cooling liquid circulation between the cooling groove 21 and the mounting groove 22.

In some examples, as shown in FIGS. 1-4 and 8, when the heat exchange module 3 is inserted into the mounting groove 22, the cooling liquid driving apparatus 33 moves close to the bottom side of the mounting groove 22, and the heat exchanger 32 is located above the cooling liquid driving apparatus 33 and adjacent to the cooling liquid driving apparatus 33. The first cooling liquid 5 cooled by the heat exchanger 32 can be timely transported to the cooling groove 21 by arranging the cooling liquid driving apparatus 33 adjacent to the heat exchanger 32, such that the cooling performance of the liquid cooling apparatus 100 is further improved.

In some examples, as shown in FIG. 8, the cooling liquid driving apparatus 33 includes a plurality of circulation pumps. In the case that the heat exchange module 3 is inserted into the mounting groove 22, each circulation pump will be close to a corresponding through hole of the first set of through holes 61. Through such an arrangement, the plurality of circulation pumps can drive the first cooling liquid 5 into the corresponding through holes such that a speed of the first cooling liquid 5 circulating between the mounting groove 22 and the cooling groove 21 can be further increased.

In some examples, an additional circulation pump may be provided adjacent to each through hole of the first set of through holes 61. Through such a redundant design, stability of the first cooling liquid 5 circulating between the mounting groove 21 and the cooling groove 22 can be improved.

In other examples, the cooling liquid driving apparatus 33 may also include other types of driving units or use other arrangements, which is not strictly limited in an example of the disclosure.

In some examples, as shown in FIG. 8, the heat exchange module 3 further includes a plurality of cooling liquid replacement blocks 34. In the case that the heat exchange module 3 is inserted into the mounting groove 22, the plurality of cooling liquid replacement blocks 34 may be at least partially immersed in the first cooling liquid 5 in the mounting groove 22. In this way, the cooling liquid replacement blocks 34 can reduce a volume of the first cooling liquid 5 in the mounting groove 22 such that a liquid level of the first cooling liquid 5 in the mounting groove 22 can be risen, a usage amount of the first cooling liquid 5 required in the cabinet 2 and overall cost are reduced.

In some examples, as shown in FIGS. 1-4 and 8, when the heat exchange module 3 is inserted into the mounting groove 22, the plurality of cooling liquid replacement blocks 34 are close to the top side of the mounting groove 22. In other examples, the cooling liquid replacement blocks 34 may also be provided at other positions, which is not strictly limited in an example of the disclosure.

In some examples, as shown in FIG. 8, channels 35 for the first cooling liquid 5 to flow through are provided between adjacent cooling liquid replacement blocks 34 of the plurality of cooling liquid replacement blocks 34. The first cooling liquid 5 may flow through the channels 35 between the cooling liquid replacement blocks 34, such that a stable fluid path is formed.

As shown in FIGS. 1-4 and 8, in some examples, the heat exchange module 3 includes a support portion 36 located at a top. When the heat exchange module 3 is inserted into the mounting groove 22, the support portion 36 is located outside the mounting groove 22 and supported by the outer frame 23. In this way, overall weight of the heat exchange module 3 can be reliably supported on the outer frame 23.

In some examples, a second seal ring (not shown) is provided on a side of the support portion 36 facing the mounting groove 22. When the heat exchange module 3 is inserted into the mounting groove 22, the support portion 36 is sealed off from the mounting groove 22 by the second seal ring. Performance of seal between the support portion 36 and the mounting groove 22 can be improved by using the second seal ring, such that leakage of the first cooling liquid 5 in the mounting groove 22 is further reduced.

As shown in FIGS. 1-4 and 8, in some examples, a pair of handles 37 are provided on the support portion 36. By gripping the handles 37, an operator can conveniently operate the heat exchange module 3, for instance, pull out the heat exchange module 3 from the mounting groove 22 or insert the heat exchange module 3 into the mounting groove 22.

Return to FIGS. 1-4, in some examples, the immersed liquid cooling apparatus 100 further includes a height-adaptive support 7. The height-adaptive support 7 is provided under the cooling groove 21 and supports the cooling groove 21. Through such an arrangement, a user can match, according to actual depth requirements of the electronic device 4, liquid cooling devices having different height-adaptive supports 7 such that a usage amount of the first cooling liquid 5 can be greatly reduced, and carbon neutralization can be boosted. In some cases, the height-adaptive support 7 may also support the mounting groove 22.

Figure 9:
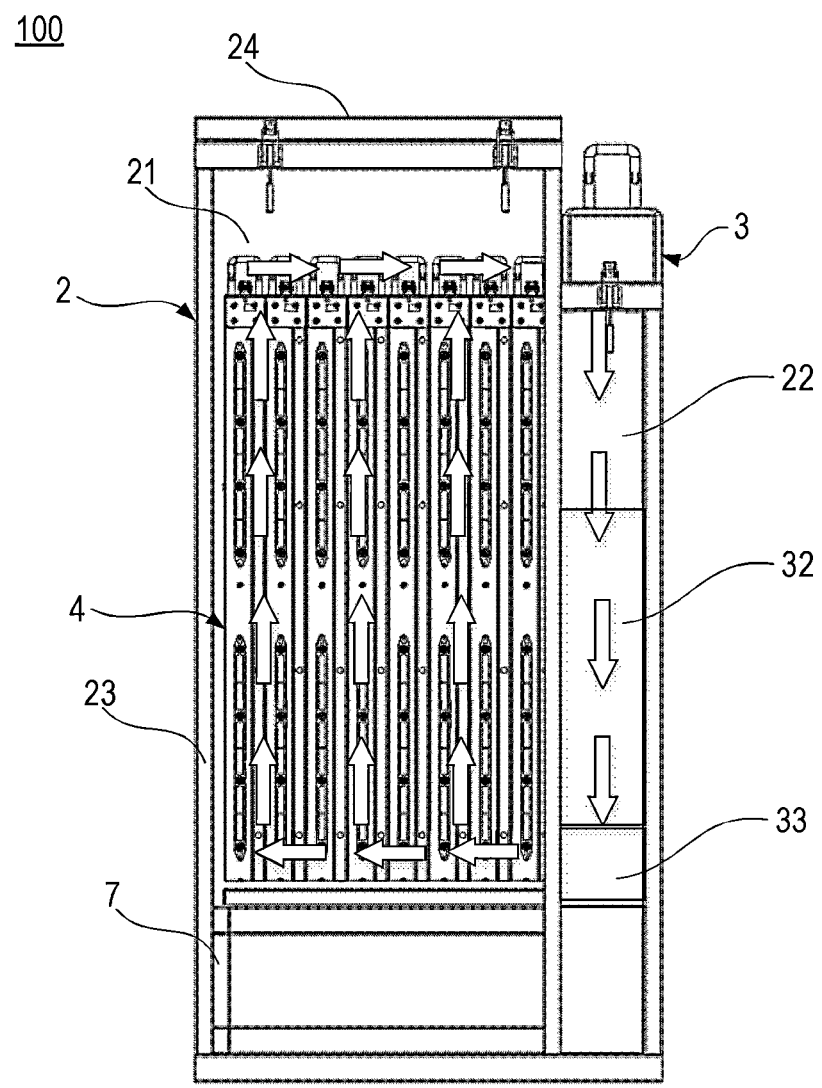
FIG. 9 shows a schematic flow path of a first cooling liquid.

FIG. 9 shows a schematic flow path of a first cooling liquid 5, which is indicated by an arrow. As shown in FIG. 9, when the heat exchange module 3 is inserted into the mounting groove 22, the heat exchanger 32 and the cooling liquid driving apparatus 33 may be immersed in the first cooling liquid 5. Since the second cooling liquid received by means of the cooling liquid circulation pipeline 31 exits in the heat exchanger 32, a temperature of the first cooling liquid 5 in the mounting groove 22 can be reduced by the second cooling liquid. The cooling liquid driving apparatus 33 then drives the first cooling liquid 5 in the mounting groove 22 into the cooling groove 21 through the first set of through holes 61. The first cooling liquid flows through the electronic device 4 from bottom to top to cool the electronic device. Then, the first cooling liquid 5 in the cooling groove 21 after absorbing heat from the electronic device 4 flows into the mounting groove 22 through the second set of through holes 62. The first cooling liquid 5 advances from top to bottom again in the mounting groove 22 and is cooled by the heat exchanger 32 to perform next circulation.

In some examples, as shown in FIG. 9, the second cooling liquid in the heat exchanger 32 may flow in a left-right direction, while the first cooling liquid 5 in the mounting groove 22 may flow up and down in a vertical direction, such that heat exchange in a form of cross flow is formed, and heat exchange efficiency of the heat exchanger 32 is enhanced.

In some examples, the electronic device 4 includes a server or a switch. In other examples, the electronic device 4 may also be in other types, which is not strictly limited in an example of the disclosure.

Figure 10:
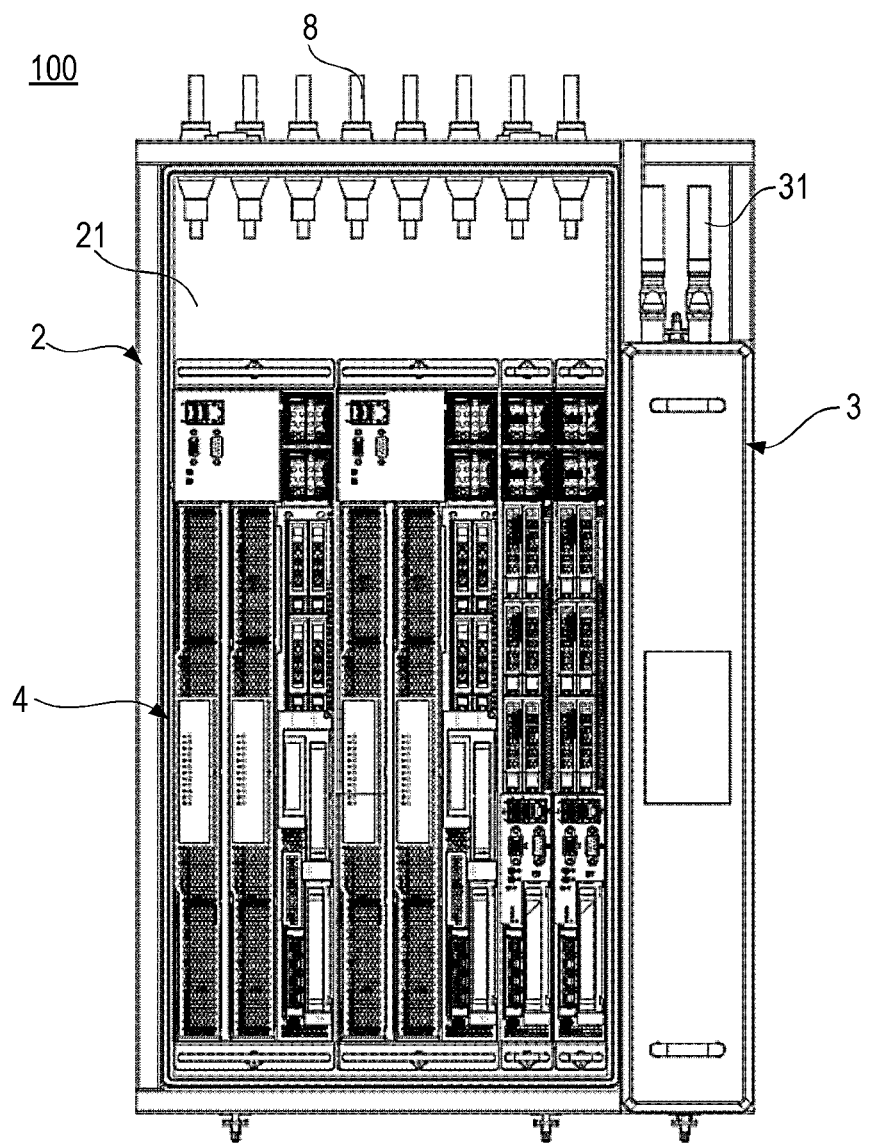
FIGS. 10-12 show different arrangements of an electronic device of an immersed liquid cooling apparatus according to an example of the disclosure.
Figure 11:
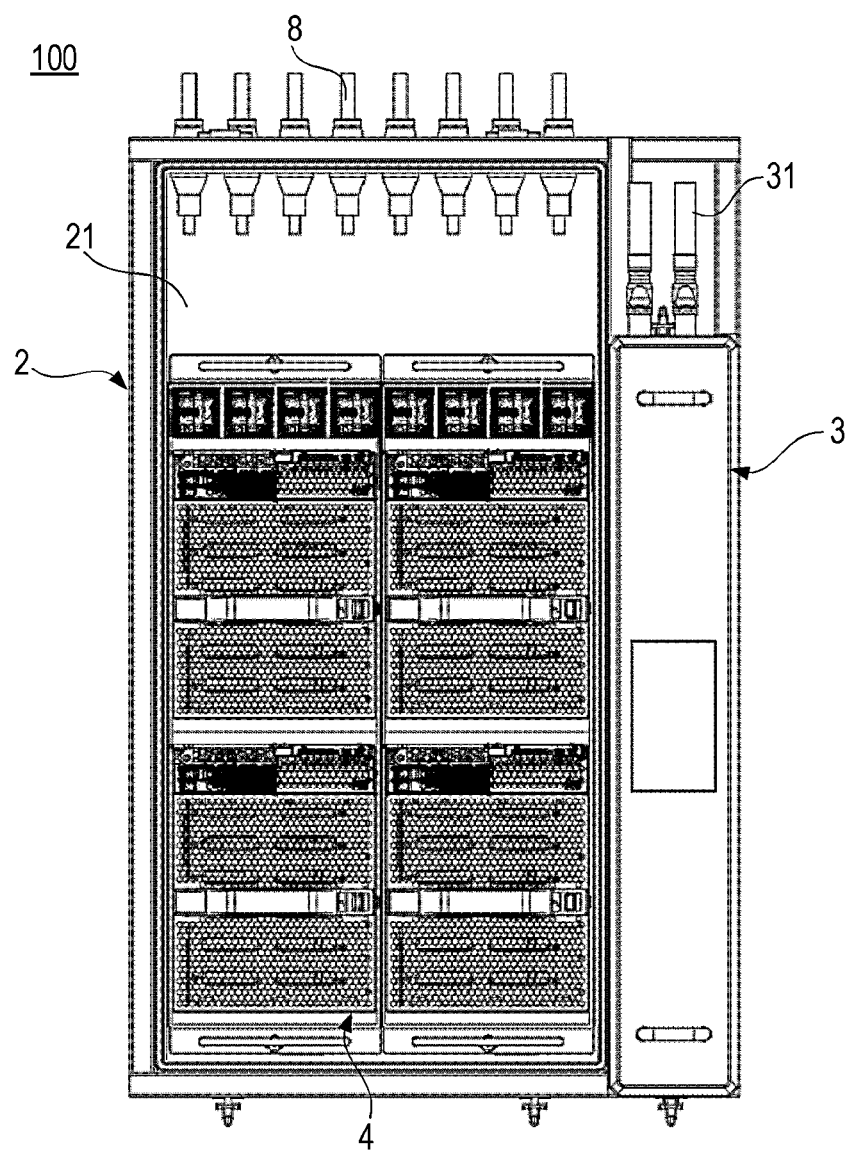
Figure 12:
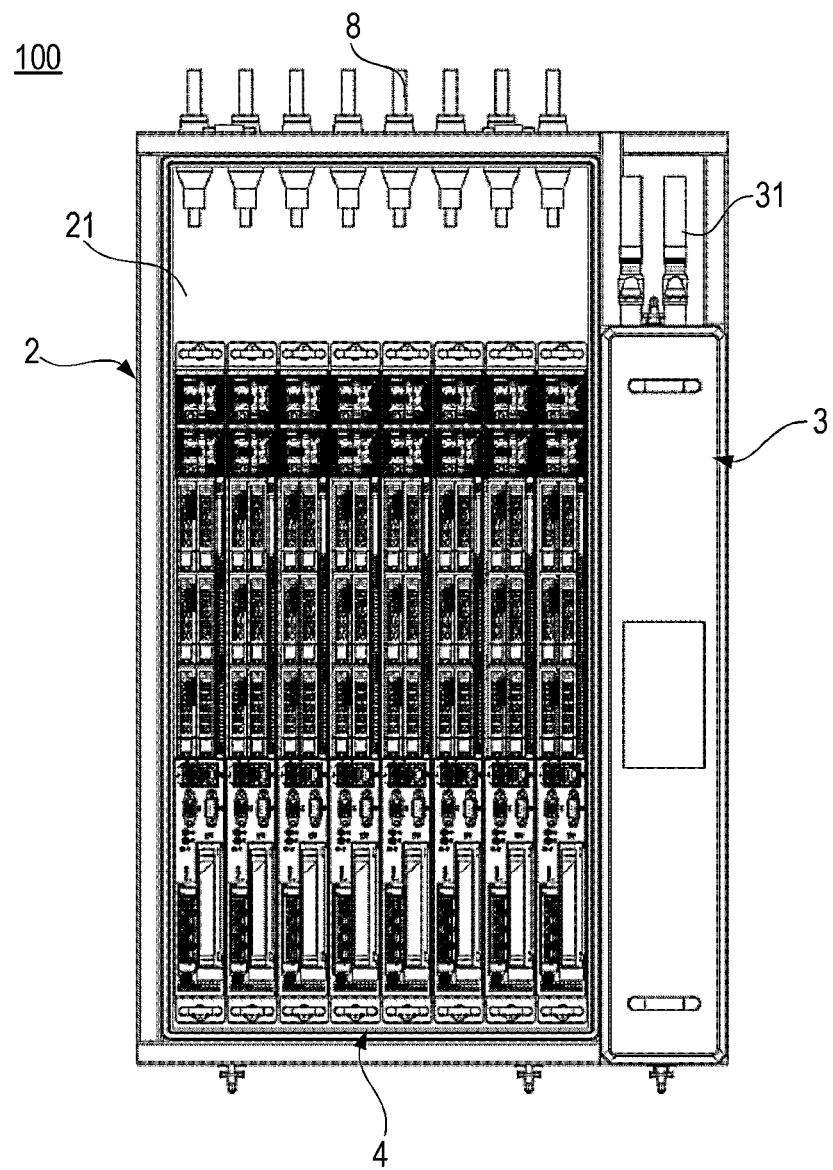

FIGS. 10-12 show different arrangements of an electronic device 4 of an immersed liquid cooling apparatus 100 according to an example of the disclosure. As shown in FIG. 10, the electronic device 4 includes both a computation server and a storage server. As shown in FIG. 11, the electronic device 4 mainly includes a storage server. As shown in FIG. 12, the electronic device 4 mainly includes a computation server. In some examples, a size of the cabinet 2 of the immersed liquid cooling apparatus 100 shown in FIGS. 10-12 may be, for instance, 8 U. In other examples, the size of the cabinet 2 may be greater than or less than 8 U, which is not strictly limited in an example of the disclosure.

As shown in FIG. 1, in a case that a height in height direction Z and a width in width direction Y of the cabinet 2 according to an example of the disclosure are substantially the same as those of a conventional cabinet, a length in length direction X of the cabinet 2 is only about one sixth of that of the conventional cabinet. For instance, in a case that the cabinet has a height ranging from 1000 mm to 1100 mm (for instance, about 1050 mm) and a width ranging from 750 mm to 850 mm (for instance, about 800 mm), the conventional cabinet has a length generally about 3 m, while the cabinet 2 in an example of the disclosure has a length of only 500 mm. The size is significantly reduced. In an example according to the disclosure, the length of the cabinet 2 in length direction X may be adjusted according to a number of electronic devices 4 provided in the cabinet. It is recommended to keep the length ranging from 500 mm to 800 mm.

FIGS. 10-12 further show an electrically-conductive terminal 8, which is configured to be connected to the electronic device 4 to perform power supply and signal/data transmission to the electronic device 4.

As shown in FIGS. 10-12, since the size of the cabinet 2 is less than that in a conventional liquid cooling solution, an operator can stand on either side of the cabinet 2 to operate the electronic device 4 in the cabinet 2.

In an example according to the disclosure, by integrating the cabinet 2 with the heat exchange module 3 and completing cooling exchange through liquid-liquid heat exchange in the entire system, a new architecture of an immersed liquid cooling data center can be greatly simplified.

Figure 13:
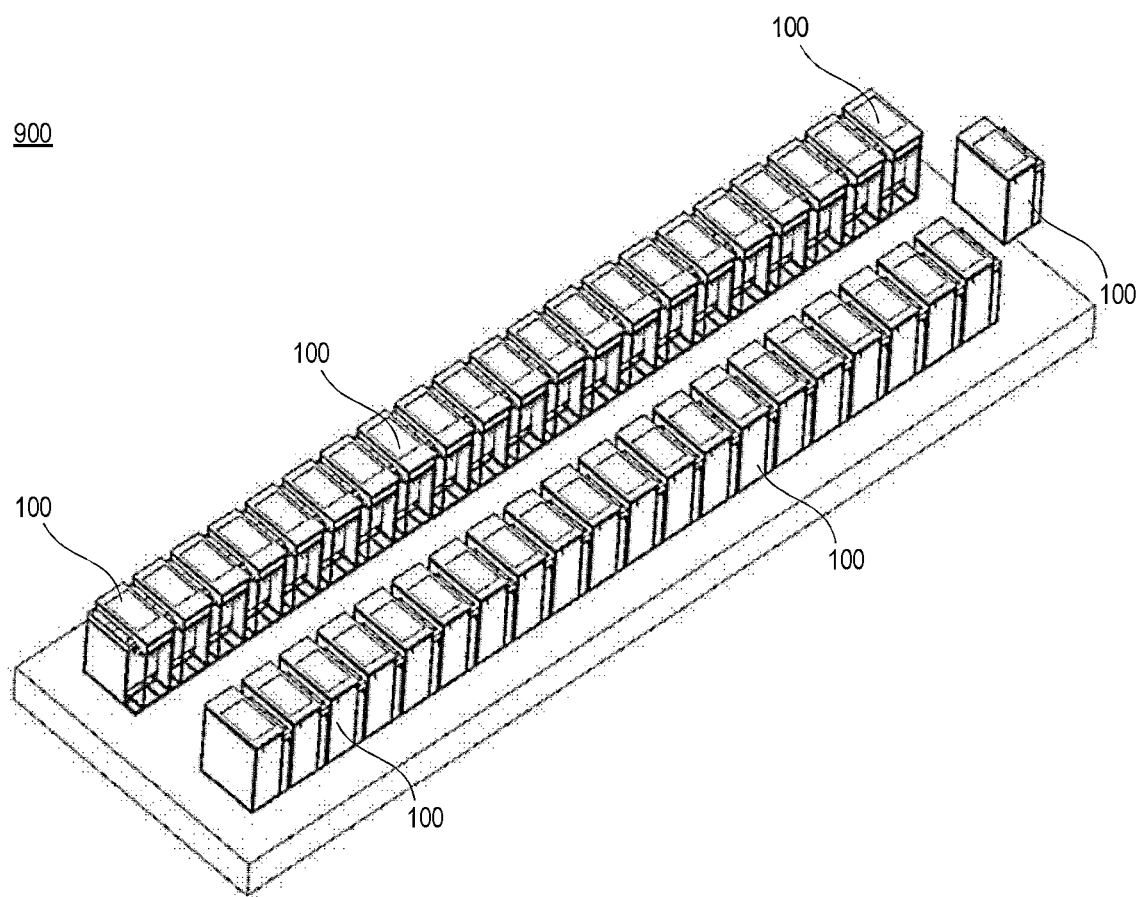
FIG. 13 shows a schematic structural diagram of a liquid cooling system according to an example of the disclosure.

FIG. 13 shows a schematic structural diagram of a liquid cooling system 900 according to an example of the disclosure. As shown in FIG. 13, the liquid cooling system 900 includes a plurality of immersed liquid cooling apparatuses 100 provided side by side. Each immersed liquid cooling apparatus 100 of the plurality of immersed liquid cooling apparatuses 100 may be any of the immersed liquid cooling apparatuses 100 described in combination with FIGS. 1-12.

Whether the immersed liquid cooling apparatuses are deployed in a small, medium or large data center, users can set a number of the immersed liquid cooling apparatuses 100 according to service requirements, such that service systems of different scales are formed, and a more flexible and efficient immersed liquid cooling system deployment mode is brought to the data center. Moreover, the problem of excessive loss of single failure caused by a large number of information technology (IT) devices in a single cabinet is solved. For instance, in some usage scenarios of edge computation, such small immersed liquid cooling apparatuses 100 may be sparely and independently deployed, which brings more application scenarios of miniaturized flexible deployment.

In addition, during large-scale cluster deployment, the immersed liquid cooling apparatus 100 may be provided in a computer room of a data center in advance by pre-positioning the cabinet 2 and the heat exchange module 3 in the data center, and the cooling liquid circulation pipeline 31 is connected to a primary side cooling liquid providing system (such as a cooling tower) for debugging. Subsequently, when there is a service requirement, the user can purchase an IT device, deploy the IT device into the cooling groove 21 of the cabinet 2, and finally add the first cooling liquid 5 to the cooling groove, such that the entire system is deployed. In this way, deployment time of the data center can be greatly reduced.

An example of the disclosure further provides a data center deployed in a large-scale cluster manner. The data center includes a plurality of immersed liquid cooling apparatuses 100, which are pre-provided in a computer room of a data center, where each immersed liquid cooling apparatus 100 is internally provided with no electronic device 4 and filled with no first cooling liquid 5; and a primary side cooling liquid providing system (such as a cooling tower), which is connected to the cooling liquid circulation pipeline 31 in the heat exchange module 3 of each immersed liquid cooling apparatus 100 by means of a liquid transportation pipeline. Through such an arrangement, the immersed liquid cooling apparatus 100 can be connected to the primary side cooling liquid providing system for debugging in advance, which is conducive to rapid large-scale cluster deployment.

In an example according to the disclosure, the cooling groove 21 of the cabinet 2 in the immersed liquid cooling apparatus 100 may be designed to have different sizes, for instance, different depths, to be used for accommodating IT devices having different sizes, such as 4 U and 8 U. U represents a height unit of the IT device, 1 U=1.75 in=4.445 cm, 4 U=7 in=17.78 cm, and 8 U=14 in=35.56 cm. Correspondingly, the height-adaptive support 7 may have different sizes such that the same set of outer frame 23 can be suitable for different cooling grooves 21. In some examples, the height-adaptive support 7 may also be a height-adjustable height-adaptive support.

For instance, the computation server generally has a depth of 600 mm, and the storage server has a depth of 800 mm. The cabinet 2 can adjust the depth of the cooling groove 21 by means of the height-adaptive support 7 at a bottom. By designing the cooling grooves 21 having different depths, an amount of a cooling liquid used by the IT device in the liquid cooling system 900 can be reduced by about 5%-33%.

An example of the disclosure provides a design of a liquid cooling system with a heat exchanger integrated therein. Self-circulating cooling of IT devices such as servers and switches provided in the liquid cooling system is efficiently implemented. Data center investment and overall operating cost are reduced. Overall power utilization efficiency (PUE) of the data center is controlled below 1.1. Carbon neutralization is boosted.

Various examples of the disclosure are described above. The above descriptions are exemplary, not exhaustive and not limited to the disclosed various examples. Many modifications and variations will be apparent to those of ordinary skill in the art without departing from the scopes and spirits of the described various examples. The terms used herein are chosen to best explain the principles and practical application of various examples or technical improvement in the market, or enable others of ordinary skill in the art to understand various examples disclosed herein.

We claim:

1. An immersion liquid cooling apparatus, comprising:
a cabinet, wherein the cabinet comprises a cooling groove and a mounting groove integrated on an outer wall of the cooling groove, the cooling groove is used for accommodating an electronic device to be cooled and a first cooling liquid, the mounting groove is used for accommodating the first cooling liquid, and the cooling groove is in fluid communication with the mounting groove by means of a through hole; and
a heat exchange module suitable for being inserted into the mounting groove, wherein the heat exchange module comprises a cooling liquid circulation pipeline, a heat exchanger and a cooling liquid driving apparatus, the cooling liquid circulation pipeline is in fluid communication with the heat exchanger to be used for providing a second cooling liquid for the heat exchanger, the heat exchanger is used for using the second cooling liquid inside the heat exchanger to cool the first cooling liquid outside the heat exchanger, and the cooling liquid driving apparatus is used for enabling the first cooling liquid to be circulated between the mounting groove and the cooling groove.

2. The immersion liquid cooling apparatus according to claim 1, wherein the through hole comprises a first set of through holes and a second set of through holes, wherein in a case that the heat exchange module is inserted into the mounting groove, the cooling liquid driving apparatus is provided to be close to the first set of through holes to be used for driving the first cooling liquid in the mounting groove into the cooling groove and enabling the first cooling liquid in the cooling groove to flow into the mounting groove by means of the second set of through holes.

3. The immersion liquid cooling apparatus according to claim 2, wherein the first set of through holes are provided to be close to a bottom side of the mounting groove, and the second set of through holes are provided to be close to a top side of the mounting groove.

4. The immersion liquid cooling apparatus according to claim 3, wherein in the case that the heat exchange module is inserted into the mounting groove, the cooling liquid driving apparatus moves close to the bottom side of the mounting groove, and the heat exchanger is located above the cooling liquid driving apparatus and provided adjacent to the cooling liquid driving apparatus.

5. The immersion liquid cooling apparatus according to claim 2, wherein the cooling liquid driving apparatus comprises a plurality of circulation pumps, wherein in the case that the heat exchange module is inserted into the mounting groove, each of the plurality of circulation pumps moves close to a respective through hole of the first set of through holes.

6. The immersion liquid cooling apparatus according to claim 1, wherein the cabinet further comprises an outer frame and a top cover, the outer frame is provided to surround the cooling groove and the mounting groove, and the top cover is rotatably connected to the outer frame and is switchable between a closed state in which the cooling groove is closed and an opened state in which the cooling groove is opened.

7. The immersion liquid cooling apparatus according to claim 6, wherein the top cover comprises a frame and a transparent portion surrounded by the frame.

8. The immersion liquid cooling apparatus according to claim 6, wherein a first seal ring is provided on a side of the top cover facing the cooling groove, wherein in a case that the top cover is in the closed state, the top cover is sealed off from the cooling groove by the first seal ring.

9. The immersion liquid cooling apparatus according to claim 6, wherein the cabinet further comprises a hydraulic driving apparatus, and the hydraulic driving apparatus is connected between the outer frame and the top cover for driving the top cover to be switched between the closed state and the opened state.

10. The immersion liquid cooling apparatus according to claim 9, wherein the hydraulic driving apparatus comprises a pair of hydraulic rods, one of the pair of hydraulic rods is connected between a first side of the top cover and the outer frame, the other one of the pair of hydraulic rods is connected between a second side of the top cover and the outer frame, and the first side and the second side of the top cover are opposite sides.

11. The immersion liquid cooling apparatus according to claim 6, wherein the immersion liquid cooling apparatus further comprises a height-adaptive support, and the height-adaptive support is provided under the cooling groove and supports the cooling groove.

12. The immersion liquid cooling apparatus according to claim 1, wherein the heat exchange module further comprises a plurality of cooling liquid replacement blocks, wherein in a case that the heat exchange module is inserted into the mounting groove, the plurality of cooling liquid replacement blocks are able to be at least partially immersed into the first cooling liquid in the mounting groove.

13. The immersion liquid cooling apparatus according to claim 12, wherein in the case that the heat exchange module is inserted into the mounting groove, the plurality of cooling liquid replacement blocks is provided to be close to a top side of the mounting groove.

14. The immersion liquid cooling apparatus according to claim 12, wherein channels for the first cooling liquid to flow through are provided between adjacent cooling liquid replacement blocks of the plurality of cooling liquid replacement blocks.

15. The immersion liquid cooling apparatus according to claim 1, wherein the heat exchange module further comprises a support portion, wherein in a case that the heat exchange module is inserted into the mounting groove, the support portion is located outside the mounting groove.

16. The immersion liquid cooling apparatus according to claim 15, wherein a second seal ring is provided on a side of the support portion facing the mounting groove, wherein in the case that the heat exchange module is inserted into the mounting groove, the support portion is sealed off from the mounting groove by the second seal ring.

17. The immersion liquid cooling apparatus according to claim 1, wherein the cabinet has a height ranging from 1000 mm to 1100 mm, a width ranging from 750 mm to 850 mm and a length ranging from 500 mm to 800 mm.

18. The immersion liquid cooling apparatus according to claim 1, wherein the first cooling liquid comprises a fluorinated liquid or mineral oil, and/or the second cooling liquid comprises deionized water.

19. The immersion liquid cooling apparatus according to claim 1, wherein the electronic device comprises a server or a switch.

20. An immersion liquid cooling system, comprising a plurality of immersion liquid cooling apparatuses provided side by side, wherein each immersion liquid cooling apparatus of the plurality of immersion liquid cooling apparatuses comprises:
  a cabinet, wherein the cabinet comprises a cooling groove and a mounting groove integrated on an outer wall of the cooling groove, the cooling groove is used for accommodating an electronic device to be cooled and a first cooling liquid, the mounting groove is used for accommodating the first cooling liquid, and the cooling groove is in fluid communication with the mounting groove by means of a through hole; and
  a heat exchange module suitable for being inserted into the mounting groove, wherein the heat exchange module comprises a cooling liquid circulation pipeline, a heat exchanger and a cooling liquid driving apparatus, the cooling liquid circulation pipeline is in fluid communication with the heat exchanger to be used for providing a second cooling liquid for the heat exchanger, the heat exchanger is used for using the second cooling liquid inside the heat exchanger to cool the first cooling liquid outside the heat exchanger, and the cooling liquid driving apparatus is used for enabling the first cooling liquid to be circulated between the mounting groove and the cooling groove.

* * * * *